United States Patent
Raj et al.

(10) Patent No.: US 10,749,532 B1
(45) Date of Patent: Aug. 18, 2020

(54) METHOD AND APPARATUS FOR A PHASE LOCKED LOOP CIRCUIT

(71) Applicant: Xilinx, Inc., San Jose, CA (US)

(72) Inventors: Mayank Raj, Sunnyvale, CA (US); Didem Z. Turker Melek, San Jose, CA (US); Parag Upadhyaya, Los Gatos, CA (US); Yohan Frans, Palo Alto, CA (US); Kun-Yung Chang, Los Altos Hills, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/291,286

(22) Filed: Mar. 4, 2019

(51) Int. Cl.
| H03L 1/02 | (2006.01) |
|---|---|
| H03L 7/093 | (2006.01) |
| H03L 7/099 | (2006.01) |
| H03L 7/07 | (2006.01) |
| H03L 7/10 | (2006.01) |

(52) U.S. Cl.
CPC .................. *H03L 1/02* (2013.01); *H03L 7/07* (2013.01); *H03L 7/093* (2013.01); *H03L 7/0995* (2013.01); *H03L 7/102* (2013.01)

(58) Field of Classification Search
CPC . H03L 7/102; H03L 7/101; H03L 7/10; H03L 7/0995; H03L 7/07; H03L 1/02; H03L 1/022; H03L 1/023
See application file for complete search history.

(56) References Cited

U.S. PATENT DOCUMENTS

| 6,462,623 | B1 * | 10/2002 | Horan | H03K 3/0231 |
|---|---|---|---|---|
| | | | | 327/270 |
| 6,680,632 | B1 * | 1/2004 | Meyers | H03L 7/093 |
| | | | | 327/155 |
| 7,408,418 | B2 * | 8/2008 | Sirito-Olivier | H03L 7/107 |
| | | | | 329/325 |
| 8,248,167 | B2 * | 8/2012 | Bolton | H03L 1/022 |
| | | | | 331/1 R |
| 2009/0039969 | A1 | 2/2009 | Hachigo | |
| 2011/0316595 | A1 | 12/2011 | Bolton | |

OTHER PUBLICATIONS

PCT International Search Report issued in US2020/020187, dated May 27, 2020, 10 pages.

* cited by examiner

*Primary Examiner* — Ryan Johnson
(74) *Attorney, Agent, or Firm* — Haynes and Boone, LLP

(57) ABSTRACT

A phase locked loop (PLL) circuit includes a voltage controlled oscillator (VCO), a first loop circuit, and a second loop circuit. The first loop circuit includes a first loop filter configured to receive a first signal based on a feedback signal from the VCO and provide a first VCO frequency control signal to the VCO. The second loop circuit includes a compensation circuit configured to receive a reference signal and the first signal, and provide a second VCO frequency control signal to the VCO.

20 Claims, 9 Drawing Sheets

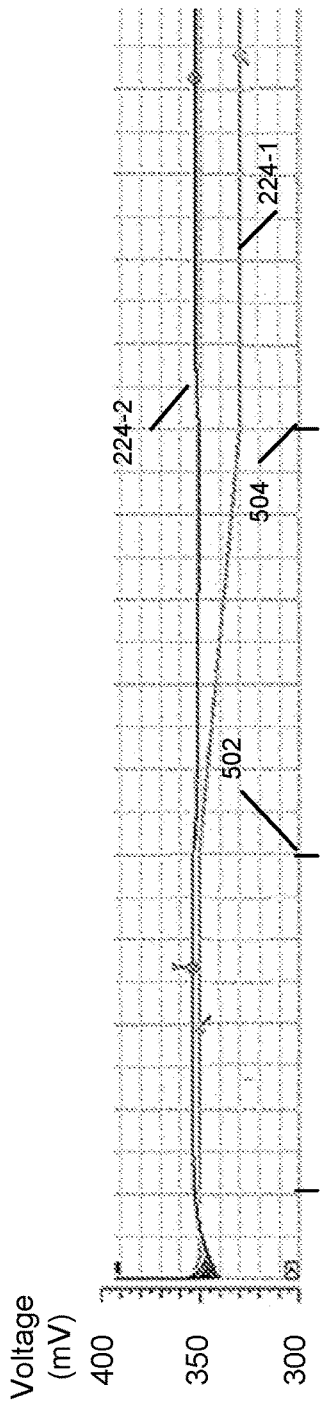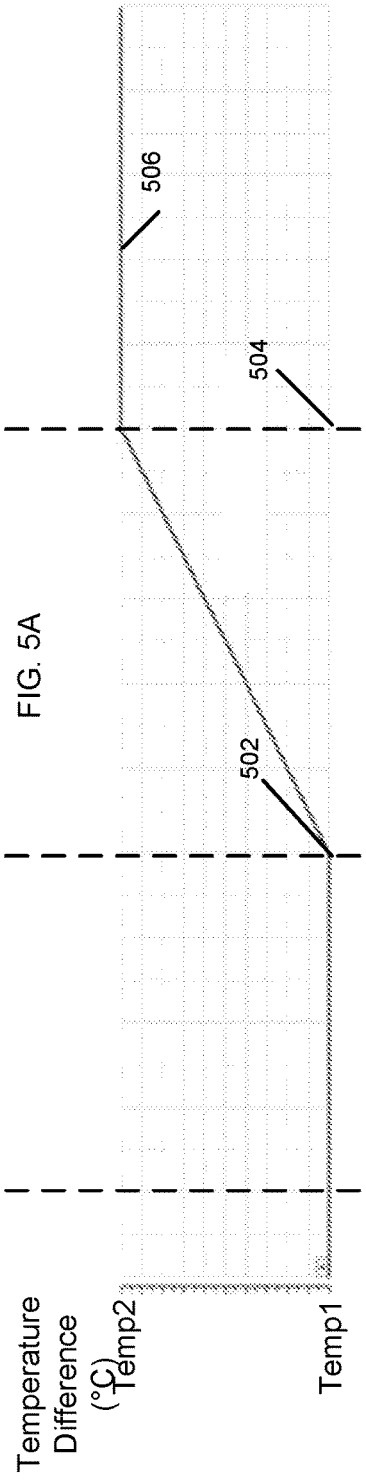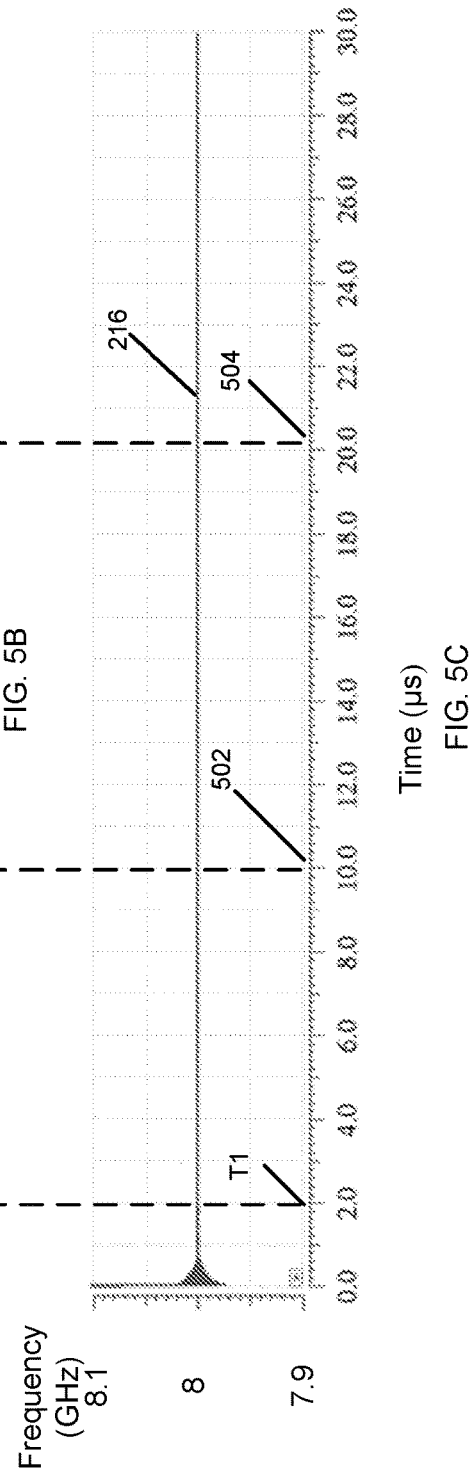
FIG. 5A
FIG. 5B
FIG. 5C

VCO Gnd Ctrl coarse_b<5:0>
642

Kvco3
662

VCO Supply Ctrl coarse<5:0>
622

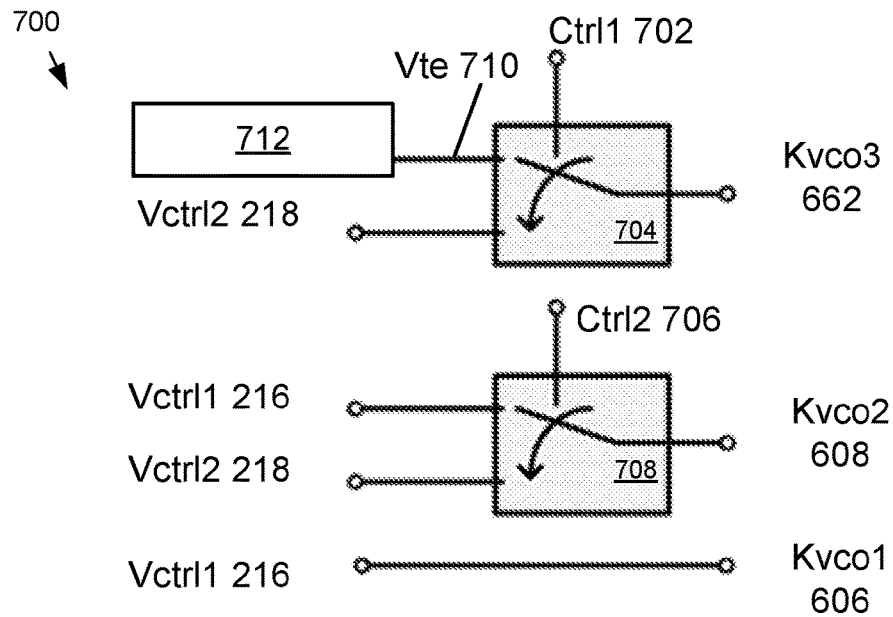

FIG. 7

| Ctrl2 706 | Ctrl1 702 | Compensation Mode 802 | Kvco1 606 | Kvco2 608 | Kvco3 662 |
|---|---|---|---|---|---|
| 0 | 0 | fully open loop | signal 226 of primary loop 220 | signal 226 of primary loop 220 | Vte of open loop |
| 1 | 0 | closed loop through varactor, open loop through current source | signal 226 of primary loop 220 | signal 228 of secondary loop 222 | Vte of open loop |
| 0 | 1 | closed loop through current source | signal 226 of primary loop 220 | signal 226 of primary loop 220 | signal 228 of secondary loop 222 |
| 1 | 1 | closed loop through varactor and current source | signal 226 of primary loop 220 | signal 228 of secondary loop 222 | signal 228 of secondary loop 222 |

FIG. 8

METHOD AND APPARATUS FOR A PHASE LOCKED LOOP CIRCUIT

FIELD

Examples of the present disclosure generally relate to integrated circuits ("ICs") and, in particular, to an embodiment related to temperature variation compensation for a phase locked loop (PLL) circuit.

BACKGROUND

Temperature variations typically have a significant impact on the locking process of a PLL circuit. During the operation of the PLL circuit, temperature changes (e.g., from −40° C. to 125° C. or vice-versa) may cause frequency drifts of the voltage controlled oscillator (VCO) of the PLL circuit. Typically, to compensation for those frequency drifts, the PLL circuit may move a VCO frequency control signal to bring the output frequency Fout of the VCO back to a required frequency (e.g., a reference frequency Fref×N). However, such a VCO frequency control signal may be outside the PLL circuit's charge pump's operation range, which may lead to a PLL lock failure.

Accordingly, it would be desirable and useful to provide an improved method and system for temperature variation compensation in a PLL.

SUMMARY

In some embodiments, a phase locked loop (PLL) circuit includes a voltage controlled oscillator (VCO), a first loop circuit including a first loop filter, and a second loop circuit including a compensation circuit. The first loop filter is configured to receive a first signal based on a feedback signal from the VCO; and provide a first VCO frequency control signal to the VCO. The compensation circuit is configured to: receive a reference signal and a second signal based on the first signal; and provide a second VCO frequency control signal to the VCO.

In some embodiments, a first bandwidth of the first loop circuit is greater than a second bandwidth of the second loop circuit.

In some embodiments, the first bandwidth is greater than the second bandwidth by at least 10 times the second bandwidth.

In some embodiments, the compensation circuit includes: an operational amplifier configured to: generate a second signal based on the second signal and the reference signal; and a second loop filter configured to generate the second VCO frequency control signal based on the second signal.

In some embodiments, the second loop filter is a low pass filter configured such that a first bandwidth of the first loop circuit is greater than a second bandwidth of the second loop circuit.

In some embodiments, the second VCO frequency control signal has a minimum voltage that is the same as a ground voltage.

In some embodiments, the VCO includes a ring oscillator.

In some embodiments, the second VCO frequency control signal is configured to control at least one of a varactor of the VCO and a current source of the VCO to control an output frequency of the VCO.

In some embodiments, the VCO is configured to: receive a third VCO frequency control signal from an open loop temperature dependent voltage circuit.

In some embodiments, the PLL circuit includes a compensation mode selection circuit configured to select a compensation mode to control an output frequency of the VCO from: a first compensation mode wherein the second VCO frequency control signal is configured to control one of a varactor of the VCO and a current source of the VCO; a second compensation mode wherein the second VCO frequency control signal is configured to control the other of the varactor of the VCO and the current source of the VCO; a third compensation mode wherein the second VCO frequency control signal is configured to control both the varactor of the VCO and the current source of the VCO; and a fourth compensation mode where the third VCO frequency control signal is configured to control both the varactor of the VCO and the current source of the VCO.

In some embodiments, a method includes receiving, by a first loop filter of a first loop circuit, a first signal based on a feedback signal from a voltage controlled oscillator (VCO), providing, by the first loop filter, a first VCO frequency control signal to the VCO; receiving, by a compensation circuit of a second loop circuit, a reference signal and the first signal; and providing, by the compensation circuit, a second VCO frequency control signal to the VCO based on a difference between the reference signal and the first signal.

In some embodiments, the method includes generating, by the compensation circuit, a second signal based on the difference between the first signal and the reference signal; and generating, using a second loop filter of the compensation circuit, the second VCO frequency control signal based on the second signal.

In some embodiments, the method includes controlling, by the second VCO frequency control signal, at least one of a varactor of the VCO and a current source of the VCO to control an output frequency of the VCO.

In some embodiments, the method includes receiving, by the VCO, a third VCO frequency control signal from an open loop temperature dependent voltage circuit.

In some embodiments, the method includes selecting a compensation mode to control an output frequency of the VCO from: a first compensation mode wherein the second VCO frequency control signal is configured to control one of a varactor of the VCO and a current source of the VCO; a second compensation mode wherein the second VCO frequency control signal is configured to control the other of the varactor of the VCO and the current source of the VCO; a third compensation mode wherein the second VCO frequency control signal is configured to control both the varactor of the VCO and the current source of the VCO; and a fourth compensation mode where the third VCO frequency control signal is configured to control both the varactor of the VCO and the current source of the VCO.

Other aspects and features will be evident from reading the following detailed description and accompanying drawings.

BRIEF DESCRIPTION OF THE DRAWINGS

FIG. 5A illustrates a comparison of voltages of signal 224 when the PLL is operating under different modes according to some embodiments of the present disclosure; FIG. 5B illustrates a temperature change at corresponding times of FIG. 5A according to some embodiments of the present disclosure; FIG. 5C illustrates the frequency of an output signal of VCO according to some embodiments of the present disclosure.

FIG. 7 illustrates a compensation mode selection circuit according to some embodiments of the present disclosure.

FIG. 8 includes a table illustrating various compensation modes according to some embodiments of the present disclosure

DETAILED DESCRIPTION

Figure 1:
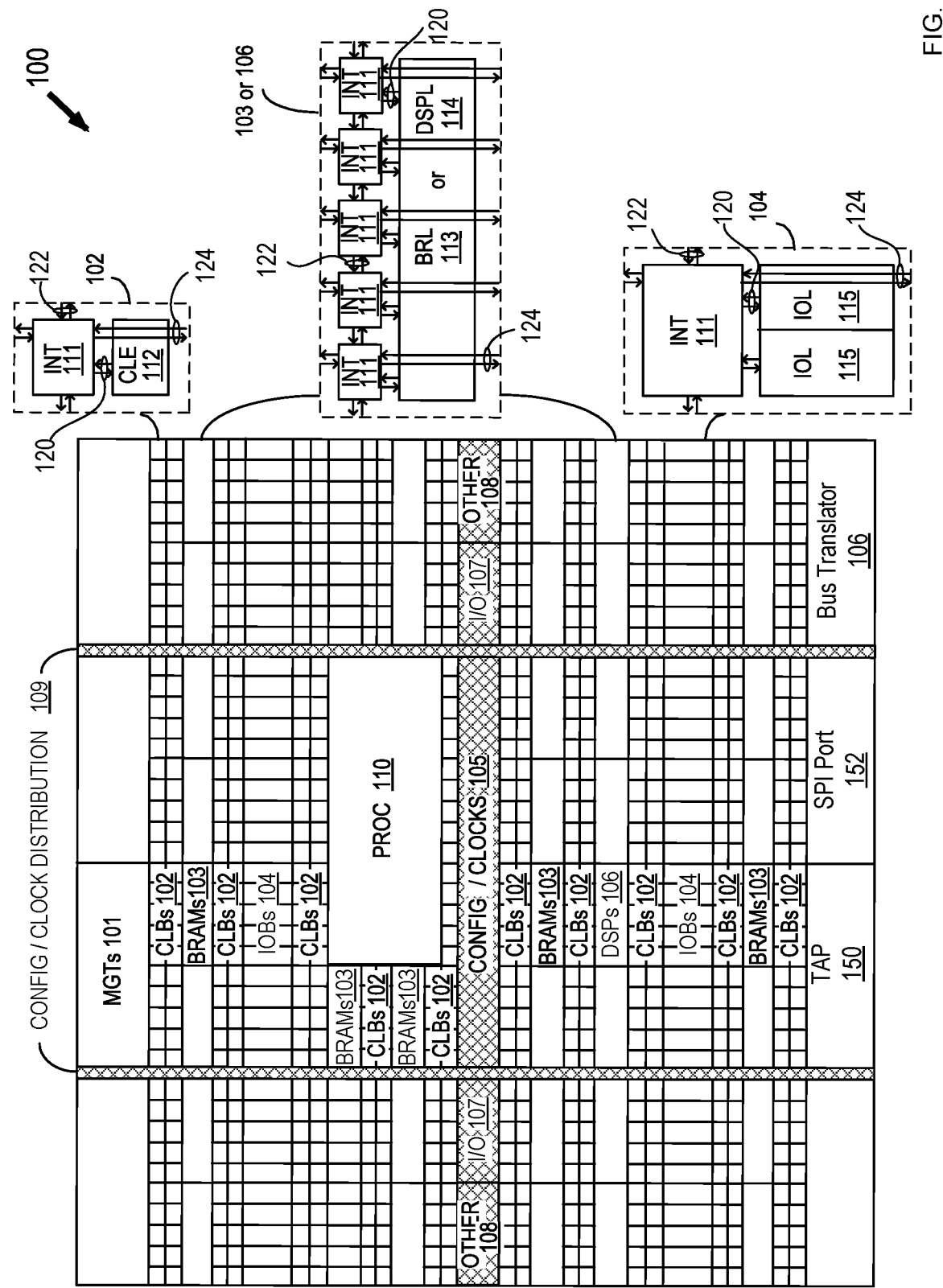
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. As discussed above, in a typical PLL circuit, to compensation for frequency drifts caused by temperature variations, the PLL circuit may move a VCO frequency control signal to bring the output frequency Fout of the VCO back to a required frequency (e.g., a reference frequency Fref×N). However, such a VCO frequency control signal may be outside the PLL circuit's charge pump's operation range, which may lead to a PLL lock failure. An open loop temperature dependent voltage circuit may be used to generate a temperature dependent voltage to control the Fout and reduce its sensitivity to temperature. However, such an open-loop compensation technique relies on models and simulations to predict that the VCO's temperature variation and temperature dependent voltage circuit are in sync. Further, such an open-loop compensation technique does not maximize the calibration potential of temperature compensation, because the temperature dependent voltage may not rail from a ground-supply range of the VCO, which may not be enough to compensate a highly temperature-dependent oscillator such as a ring oscillator in a 7 nm process.

For integrated circuit (IC) solutions, it has been discovered that by using a closed loop secondary compensation loop in a PLL circuit, a closed-loop temperature tracking loop is provided to continuously monitor VCO control signal variations caused by the temperature and provide an appropriate control signal to compensate for such variation.

Various advantages may be present in various applications of the present disclosure. No particular advantage is required for all embodiments, and different embodiments may offer different advantages. One of the advantages of some embodiments is that by using a closed secondary loop having a bandwidth less than the bandwidth of the primary loop of the PLL circuit, temperature compensation is improved while maintaining the stability of the PLL circuit without requiring the knowledge of the exact temperature behavior of the VCO. Yet another of the advantages of some embodiments is that the secondary loop may provide a VCO control signal that rails from the ground voltage to supply voltage of the VCO, which improves the temperature compensation capability of the PLL circuit. Yet another of the advantages of some embodiments is that by providing a compensation mode selection circuit for selecting from various programmable compensation modes using the primary loop control signal, secondary loop control signal, and/or open loop temperature dependent voltage control signal, more flexibility in providing temperature compensation to the VCO is achieved.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the one or more embodiments described herein is not limited to the exemplary IC depicted in FIG. 1, and that IC having other configurations, or other types of IC, may also implement those embodiments.

Figure 2:
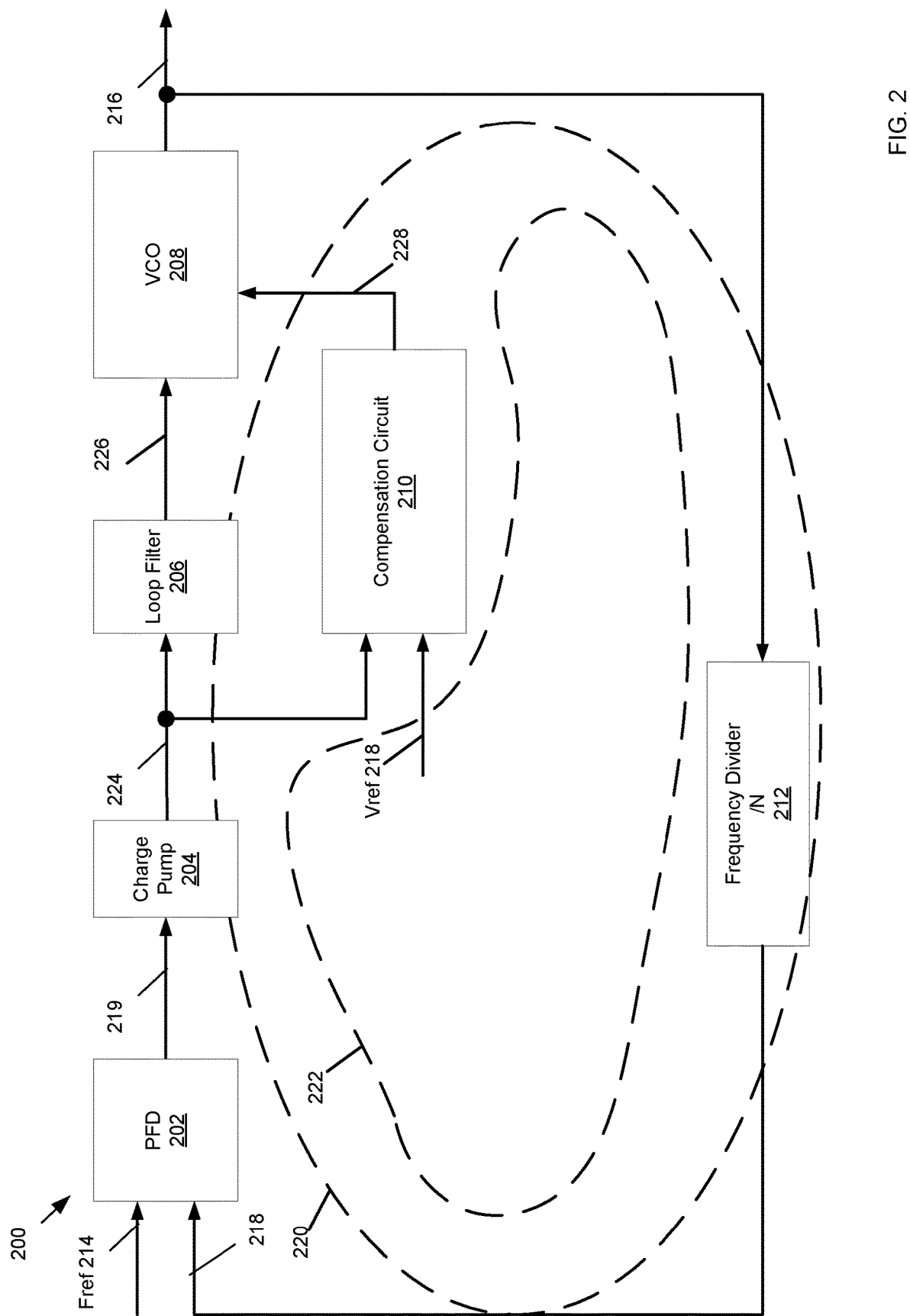
FIG. 2 is a block diagram illustrating an exemplary phase locked loop (PLL) circuit including a primary loop circuit and a secondary loop circuit according to some embodiments of the present disclosure.

Referring to the example of FIG. 2, illustrated is a temperature compensated PLL circuit 200, also referred to as a PLL circuit 200. The PLL circuit 200 receives a reference signal 214 (also referred to as a reference clock signal 214) providing a reference frequency $F_{ref}$, and generates an output signal 216 (also referred to as an output clock signal 216). The output signal 216 has a phase and frequency relationship to the reference signal 214 when the PLL circuit 200 is operated in a locked mode. In an example, in a locked mode, the output signal 216 has a frequency $F_{out}$ that is N times the reference frequency $F_{ref}$, where N is a programmable positive integer.

The PLL circuit 200 includes a primary loop 220 (also referred to as a PLL loop 220) and a secondary loop 222 (also referred to as an auxiliary loop 222 or a temperature compensation loop 222). The primary loop 220 includes a phase frequency detector (PFD) circuit 202, a charge pump circuit 204, a filter circuit 206 (also referred to as a loop filter circuit 206), a voltage control oscillator (VCO) 208, and a frequency divider circuit 212 (also referred to as a feedback divider circuit 212). The secondary loop 222 includes the PFD circuit 202, the charge pump circuit 204, a compensation circuit 210, the VCO 208, and the frequency divider circuit 212.

As shown in the example of FIG. 2, the reference signal 214 is coupled to the PFD circuit 202. The PFD circuit 202 also receives a feedback signal 217, which has a frequency that is 1/N of the frequency $F_{out}$ of the output signal 216, where N is a programmable positive integer. The PFD circuit 202 generates an output signal 219 indicative of a frequency and/or phase difference between the reference signal 214 and the feedback signal 217. The feedback signal 217 is generated by the frequency divider circuit 212 based on the output signal 216. The feedback signal 217 may have the same frequency and/or phase as those of the reference signal 214 when the PLL circuit 200 is operating in a locked mode.

The PFD circuit 202 is coupled to the charge pump circuit 204. The charge pump circuit 204 receives signal 219 from the PFD circuit 202, and generates an output signal 224. The output signal 224 may include a bias voltage responsive to the signal 219 from the PFD circuit 202. The output signal 224 of the charge pump circuit 204 may be coupled to a loop filter circuit 206.

The loop filter circuit 206 may include any suitable filter circuit, including e.g., a low pass filter. Examples of a low pass filter include a resistor-capacitor (RC) filter, a resistor-inductor (RL) filter, and a resistor-inductor-capacitor (RLC) filter. The loop filter circuit 206 generates a VCO control signal 226 (also referred to as Vctrl1), and provides the VCO control signal 226 to a voltage controlled oscillator (VCO) 208. In various embodiments, the loop filter circuit 206 may determine the primary loop 220's loop dynamics, also referred to the stability of the primary loop, indicating how the primary loop responds to disturbances (e.g., changes in the reference frequency $F_{ref}$, changes of the frequency divider circuit 212, etc.). The loop filter circuit 206 may be used to suppress a voltage ripple or noise in the signal 224. Some design trade-offs of the loop filter circuit 206 in the PLL circuit 200 include, e.g., increasing the loop bandwidth may degrade the stability, too much damping for better stability may reduce the speed and increase settling time. In some examples, the loop filter circuit 206 is programmable and includes programmable resistor(s) and/or programmable capacitor(s).

The VCO circuit 208 may generate an oscillating output signal 216, where the output signal 216 has a higher frequency or lower frequency in response to the VCO control signal 226 (e.g., a bias voltage thereof). The output signal 216 may be provided to a circuit requiring a clock signal having a frequency with a relationship (e.g., $N*F_{ref}$) to the $F_{ref}$ of the reference signal 214.

In the example of FIG. 2, the secondary loop 222 includes a compensation circuit 210. The compensation circuit receives the output signal 224 from the charge pump 204, receives a reference voltage signal 218 having a reference voltage Vref, generates a VCO control signal 228 (also referred to as Vctrl2), and provides the VCO control signal 228 to the VCO circuit 208 for controlling the frequency $F_{out}$ of the output signal 216. In some embodiments, the reference voltage Vref is determined based on an operation range of the charge pump 204. In an example, the reference voltage Vref is determined to ensure that the signal 224 is within the operation range of the charge pump 204.

Figure 3:
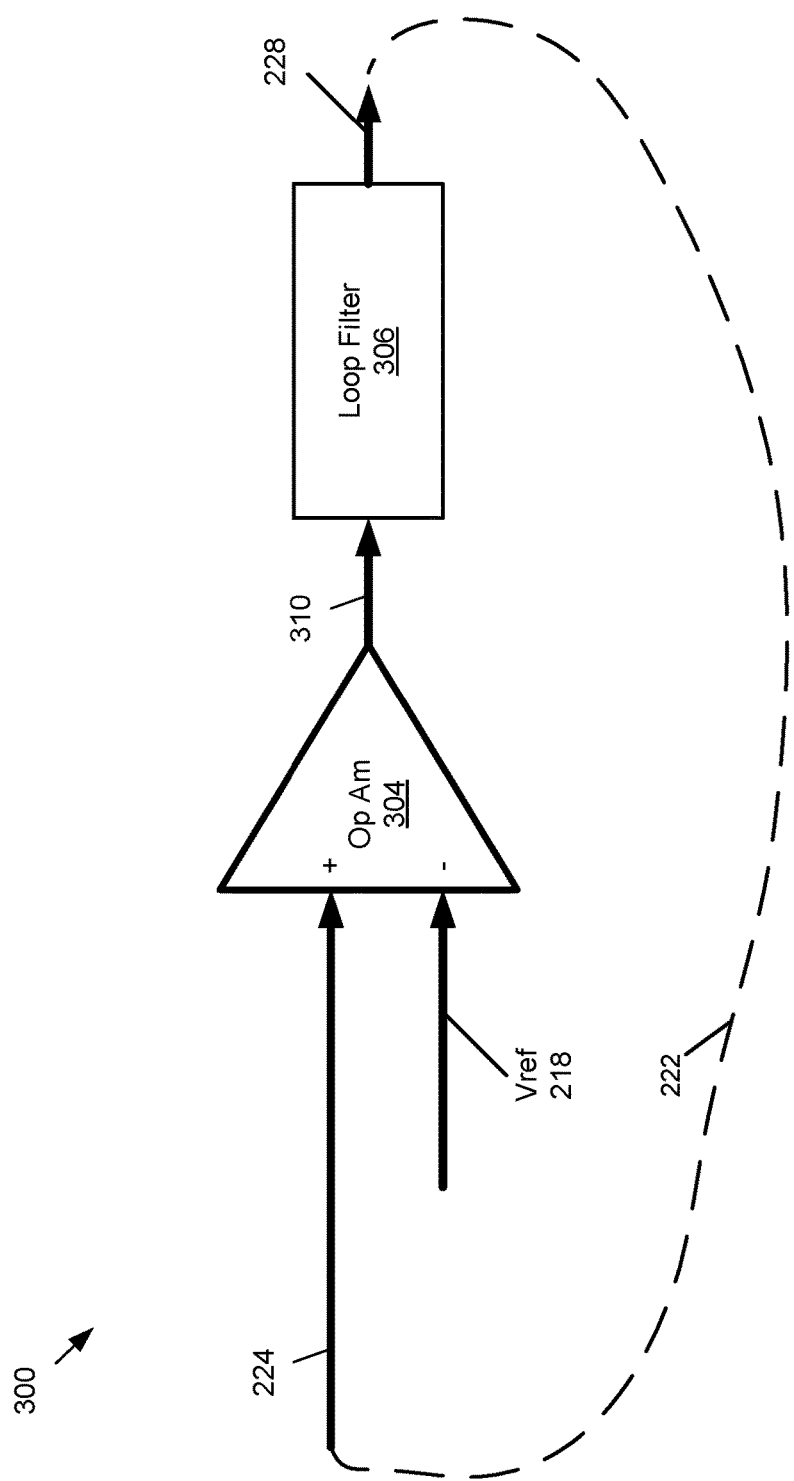
FIG. 3 is a block diagram illustrating an exemplary compensation circuit of a secondary loop circuit of a PLL circuit according to some embodiments of the present disclosure.

Referring to the FIG. 3, illustrated is an example compensation circuit 300 (e.g., compensation circuit 210 of FIG. 2) in a secondary loop 222. The compensation circuit 300 includes an operational amplifier 304, and a filter circuit 306 (also referred to as a loop filter circuit 306). A signal 224 from charge pump 204 having a voltage V1 is provided to the operational amplifier 304 (e.g., at a non-inverting input of the operational amplifier 304). The operational amplifier 304 also receives a reference voltage Vref 218 (e.g., at an inverting input of the operational amplifier 304). In an example, the Vref 218 may be provided based on a predetermined reference voltage value or be set externally by an operator. The Vref 218 may be determined based on the phase noise performance of the VCO circuit. The gain A of the operational amplifier 304 may be determined based on a performance requirement of the PLL circuit 200. For example, a higher gain A may be chosen such that the operational amplifier 304 forces the voltage V1 of the signal 224 closer to the reference voltage Vref 218 across a range of voltage changes of the voltage V1.

In various embodiments, a voltage divider may be used to scale the signal 224 to an input voltage at the non-inverting input of the operational amplifier 304 based on parameters of the operational amplifier 304. In those embodiments, the reference voltage Vref 218 may be scaled accordingly.

The operational amplifier 304 amplifies the differential input voltage, which is the difference in voltage between V1 of signal 224 and Vref 218, and generates an output signal 310. The output voltage of signal 310 may be provided as A*(V1−Vref).

A loop filter 306 receives signal 310 from the operational amplifier 304, and generates an output signal 228. In some embodiments, the loop filter 306 is a low pass filter, and is designed such that a loop response of the secondary loop 222 is slower than a loop response of the primary loop 220, which improves the stability of the PLL circuit 200.

Figure 4A:
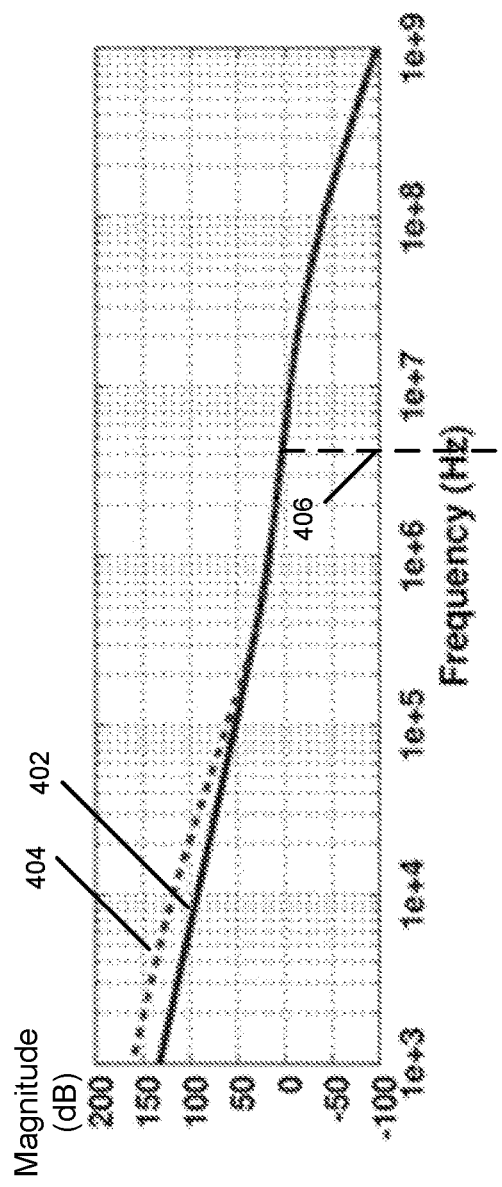
FIG. 4A illustrates a magnitude curve of the PLL circuit according to some embodiments of the present disclosure.
Figure 4B:
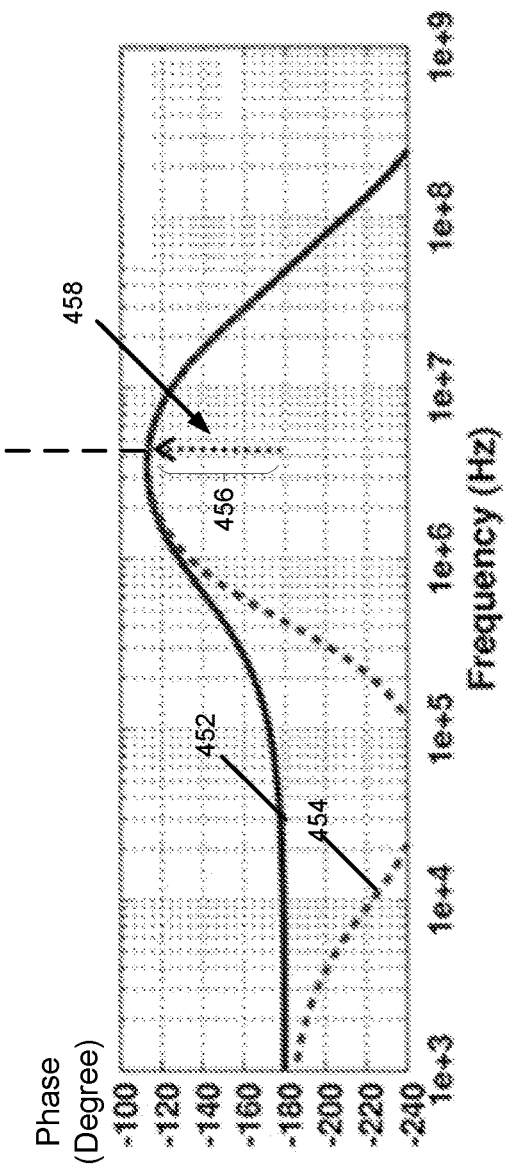
FIG. 4B illustrates a phase curve of the PLL circuit according to some embodiments of the present disclosure.

Referring to the examples of FIGS. 4A and 4B, illustrated therein are open-loop Bode plots (magnification and phase curves) of PLL circuit 200 without the secondary loop 222 (curves 402 and 452 of FIG. 4A) and with the secondary loop 222 temperature compensation loop (curves 404 and 454 of FIG. 4B). As discussed in detail below, in various embodiments, the secondary loop 222 is designed such that it does not affect the stability of the PLL circuit 200. Specifically, the secondary loop 222 may be designed (e.g., using design parameters of the Vref 218, operational amplifier 304, and/or loop filter 306) such that a PLL circuit 200 operating with both the primary loop 220 and secondary loop 222 enabled satisfy various design requirements, including, for example, a phase margin requirement to ensure stability of the PLL circuit 200.

Illustrated in FIG. 4A are magnitude curves 402 and 404 of the PLL circuit 200. Specifically, the magnitude curve 402 corresponds to the PLL circuit 200 operating with the secondary loop 222 disabled. In other words, the magnitude curve 402 corresponds to the PLL circuit 200 operating with only the primary loop 220 enabled. The magnitude curve 404 corresponds to the PLL circuit 200 operating with the secondary loop 222 enabled. In other words, the magnitude curve 404 corresponds to the PLL circuit 200 operating with both the primary loop 220 and secondary loop 222 enabled.

Illustrated in FIG. 4B are phase curves 452 and 454 of the PLL circuit 200. Specifically, the phase curve 452 corresponds to the PLL circuit 200 operating with the primary loop 220 enabled and the secondary loop 222 disabled. As shown in magnitude curve 402 and phase curve 452, a phase margin Pm1 456 (e.g., about 60°) of the primary loop 220 is the difference between the phase of the response 452 and −180° at a frequency 406 when the loop gain of the primary loop 220 is 1.0 (e.g., where the magnitude of the response is 0 dB). The phase curve 454 corresponds to the PLL circuit 200 operating with both primary loop 220 and secondary loop 222 enabled.

As shown in the example of FIGS. 4A and 4B, the secondary loop 222 is designed such that a phase margin Pm2 of the PLL circuit 200 operating with both primary loop 220 and secondary loop 222 enabled satisfies a phase margin requirement. The phase margin requirement may be based on the phase margin Pm1 456 of the primary loop 220. In an example, the secondary loop 222 is designed such that a difference between the phase margins Pm1 and Pm2 is less than 10% of the phase margin Pm1. In another example, the secondary loop 222 is designed such that a difference between the phase margins Pm1 and Pm2 is less than 1% of the phase margin Pm1.

In various embodiments, design parameters (e.g., a cutoff frequency) of the loop filter 306 (e.g., a low-pass filter) may be determined to satisfy the design requirements of the PLL circuit 200 operating with both primary loop 220 and secondary loop 222 enabled. In some embodiments, the loop filter 306 is designed such that a loop bandwidth of the secondary loop 222 is less than a loop bandwidth of the primary loop 220. In an example, the loop bandwidth of the primary loop 220 (e.g., of about 1 MHz) is equal to or more than 10 times the loop bandwidth of the secondary loop 222 (e.g., of about 10 KHz). In that particular example, a difference between the phase margins Pm1 and Pm2 is less than 1% of the phase margin Pm1.

As illustrated in the examples of FIGS. 5A, 5B, and 5C, by using a secondary loop 222 together with a primary loop 220 in a PLL circuit 200, temperature variation impacts on the PLL circuit 200 (e.g., frequency drift of the VCO) are compensated. Specifically, the secondary loop 222 includes a closed-loop temperature tracking loop, which continuously monitors the temperature variation, and provides an appropriate control signal 228 to the VCO 208 to compensate for the temperature variation. In the example of FIG. 5A, illustrated are voltage curves 224-1 and 224-2 of a PLL circuit 200. Specifically, voltage curve 224-1 illustrates the voltage versus time curve of signal 224 when the PLL circuit 200 is operating with the secondary loop 222 disabled. In other words, the voltage curve 224-1 corresponds to the PLL circuit 200 operating with only the primary loop 220 enabled. Voltage curve 224-2 illustrates the voltage versus time curve of signal 224 when the PLL circuit 200 is operating with the secondary loop 222 enabled. In other words, the voltage curve 224-2 corresponds to the PLL circuit 200 operating with both the primary loop 220 and secondary loop 222 enabled.

In the example of FIG. 5B, illustrated is a temperature difference curve 506 indicating the temperature difference at corresponding times. As shown in FIG. 5B, between times 502 and 504, the temperature changes from temperature Temp1 to temperature Temp2. In an example, such an increase in the temperature causes voltage changes in the voltage curves 224-1 and/or 224-2.

Referring back to FIG. 5A, as shown by voltage curve 224-2, by using the secondary loop 222 in the PLL circuit 200, the voltage of signal 224-2 is more stable (e.g., compared with signal 224-1) during times 502 and 504. This is achieved by compensating for the temperature changes using the secondary loop 222. Referring to the example of FIG. 5C, illustrated is a frequency curve of the output signal 216 of the VCO 208. As shown in FIG. 5C, as a result of using the secondary loop 222, the impact of temperature change on the frequency of the signal 216 is reduced, thereby providing a more stable frequency of the output signal 216 of the VCO 208.

Referring to the example of FIGS. 6A, 6B, 6C, and 6D, illustrated is a ring VCO 600 (e.g., VCO 208 of FIG. 2). In various embodiments, a PLL circuit using a ring VCO has a significant area advantage over a PLL circuit counterpart using an LC-tank VCO, but may be prone to temperature variations, especially e.g., in a highly scaled process such as a 7 nm process. By using a secondary loop 222 as a closed-loop temperature tracking loop that continuously monitors the voltage variation caused by the temperature and provides an appropriate control signal to cancel the voltage variation, temperature variation in the PLL circuit using a ring VCO is compensated and the PLL performance is improved by providing a more stable output frequency.

Figure 6A:
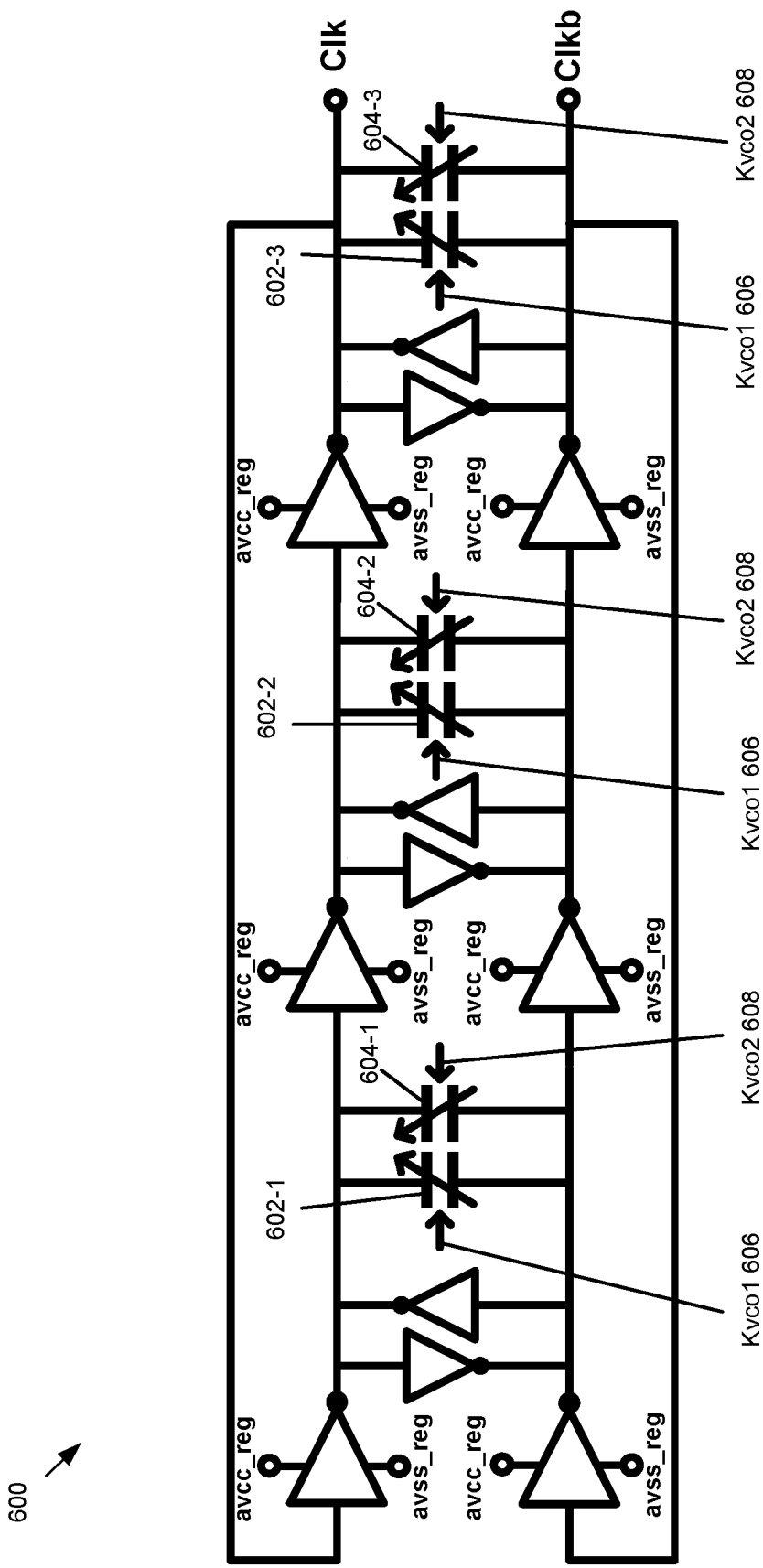
FIG. 6A illustrates an exemplary ring voltage-controlled oscillator (VCO) circuit according to some embodiments of the present disclosure.
Figure 6C:
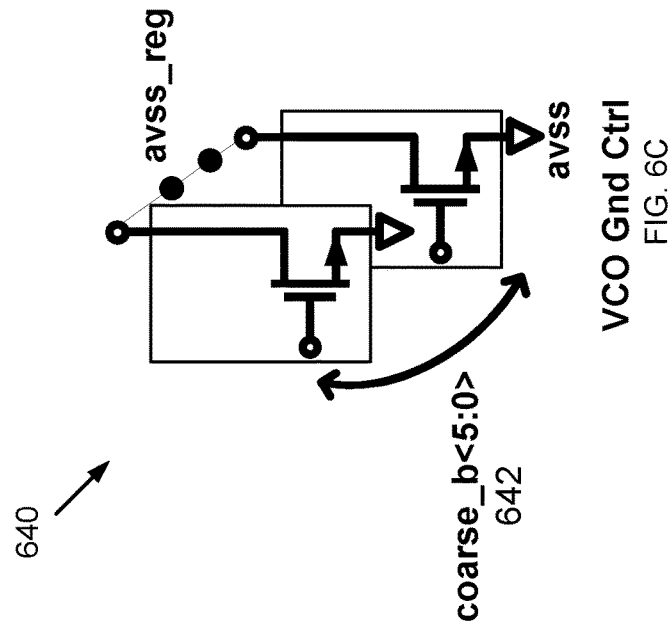
FIG. 6C illustrates a VCO ground control circuit according to some embodiments of the present disclosure.
Figure 6D:
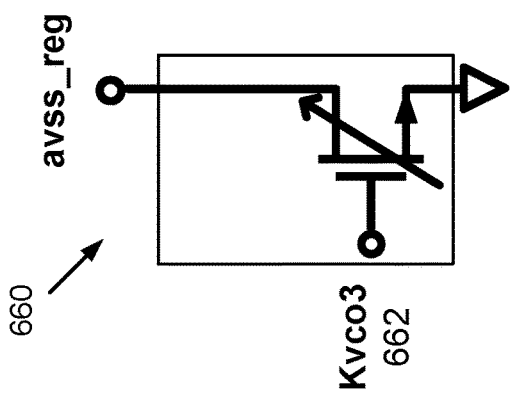
FIG. 6D illustrates a VCO current source control circuit according to some embodiments of the present disclosure.
Figure 6B:
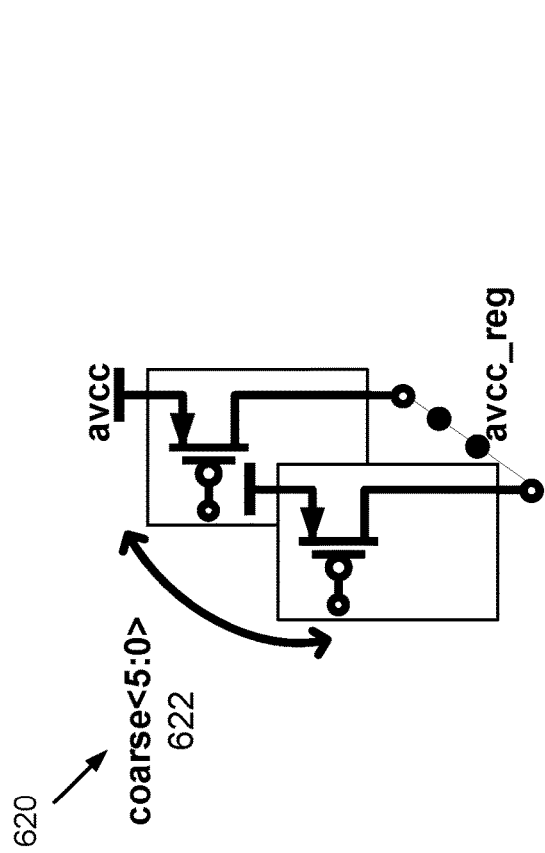
FIG. 6B illustrates a VCO supply control circuit according to some embodiments of the present disclosure.

As shown in FIG. 6A, the ring VCO 600 is a pseudo-differential three stage VCO. As shown in FIGS. 6B and 6C, in the ring VCO 600, the coarse frequency control may be implemented using pMOS transistors and control signal 622 (e.g., coarse<5:0>) in the supply path 620 and using nMOS transistors and control signal 642 (e.g., coarse_b<5:0>) in the ground path 640 respectively. As shown in FIGS. 6A and 6D, the fine frequency tuning of the ring VCO 600 is achieved using various control paths. For example, the control paths may include a Kvco1 path using a control signal 606 (also referred to as Kvco1 signal 606) controlling varactors 602-1, 602-2, and 602-3 of the delay cells of the three stages of the ring VCO 600 respectively. For further example, the control paths may include a Kvco2 path using a control signal 608 (also referred to as Kvco2 signal 608) of the closed secondary loop 222 controlling varactors 604-1, 604-2, and 604-3 of the delay cells of the three stages of the ring VCO 600 respectively. As shown in FIG. 6D, for further example, the control paths may include a Kvco3 path (e.g., by controlling ayss_reg) using an nMOS current source control circuit 660 with a control signal 662 (also referred to as Kvco3 signal 662).

Referring to the examples of FIGS. 7 and 8, a PLL circuit (e.g., PLL circuit 200 with a primary loop 220 and a secondary loop 222 of FIG. 2) including its Kvco1, Kvco2, and Kvco3 paths may be programmed to operate in various compensation modes. FIG. 7 illustrates a compensation mode control circuit 700, where compensation mode control signals Ctrl1 702 and Ctrl2 706 may be programmed (e.g., using switches 704 and 708 respectively) to generate Kvco1 signal 606, Kvco2 signal 608, and Kvco3 signal 662 using Vctrl1 226, Vctrl2 228, and a temperature dependent voltage Vte 710 generated by an open loop with a temperature dependent voltage circuit 712. For example, the Kvco1 path may be used for the primary loop 220 (e.g., signal 226 of the primary loop 220 is used as the Kvco1 signal 606). For further example, the Kvco2 path may be programmed to be used for the primary loop 220 (e.g., signal 226 of the primary loop 220 is used as the Kvco2 signal 608) or for the secondary loop 222 (e.g., signal 228 of the secondary loop 222 is used as the Kvco2 signal 608). Yet for another example, the Kvco3 path may be programmed to be used for the secondary loop 222 (e.g., signal 228 of the secondary loop 222 is used as the Kvco3 signal 662) or for an open loop with a temperature dependent voltage circuit 712.

Referring to the example of FIG. 8, various compensation modes 802 are illustrated. For example, under a "fully open loop" mode, signal 226 of primary loop 220 is provided as both Kvco1 signal 606 and Kvco2 signal 608, and Vte 710 of an open loop is provided as Kvco3 signal 662 for temperature compensation. In other words, under the "fully open loop" mode, signal 228 of the secondary loop 222 is not used for temperature compensation.

For further example, under the "closed loop through varactor, open loop through current source" mode, signal 226 of primary loop 220 is provided as Kvco1 signal 606, signal 228 of the secondary loop 222 is provided as Kvco2 signal 608 (e.g., to provide a closed loop for compensation through varactors 604-1, 604-2, and 604-3), and Vte 710 of an open loop is provided as Kvco3 signal 662 (e.g., to provide an open loop for compensation through current source control circuit 660).

For further example, under the "closed loop through current source" mode, signal 226 of primary loop 220 is provided as both Kvco1 signal 606 and Kvco2 signal 608, and signal 228 of the secondary loop 222 is provided as Kvco3 signal 662 for temperature compensation (e.g., to provide a closed loop for compensation through current source control circuit 660).

For further example, under the "closed loop through varactor and current source" mode, signal 226 of primary loop 220 is provided as Kvco1 signal 606, and signal 228 of the secondary loop 222 is provided as both Kvco2 signal 608 (e.g., to provide a closed loop for compensation through varactors 604-1, 604-2, and 604-3) and Kvco3 signal 662 (e.g., to provide a closed loop for compensation through current source control circuit 660).

Figure 9:
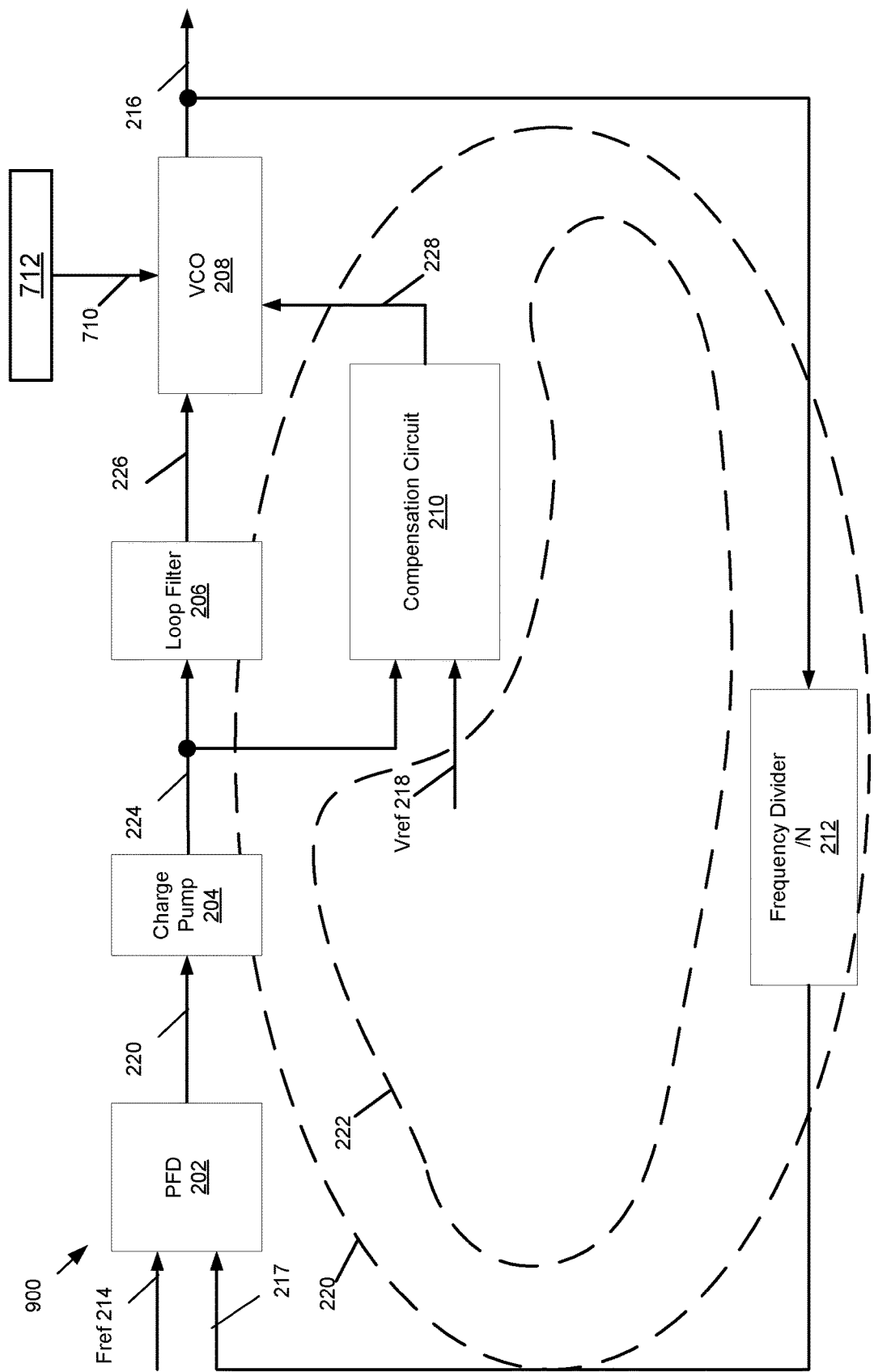
FIG. 9 is a block diagram illustrating an exemplary PLL circuit including a primary loop circuit, a secondary loop circuit, and an open loop circuit for temperature compensation according to some embodiments of the present disclosure.

Referring to the example of FIG. 9, illustrated is a PLL circuit 900 substantially similar to the PLL circuit 200 of FIG. 2 except the difference described below. The PLL circuit 900 including a primary loop 220, a secondary loop 222, and an open loop using a temperature dependent voltage Vte 710 generated by a temperature dependent voltage circuit 712. The temperature dependent voltage Vte 710 is provided to the VCO 208 for frequency tuning of the frequency of the output signal 216 (e.g., in the "fully open mode" or "closed loop through varactor, open loop through current source" mode as discussed above with reference to FIGS. 7 and 8).

It is noted that various configurations illustrated in FIGS. 1-9 are exemplary only and not intended to be limiting beyond what is specifically recited in the claims that follow. It will be understood by those skilled in that art that other configurations may be used. One or more elements in the various embodiments may be implemented by software, hardware (e.g., an application specific integrated circuit (ASIC), application-specific standard parts (ASSPs), a logic on a programmable logic IC (e.g., FPGA)), firmware, and/or a combination thereof. The embodiments may be implemented using various hardware resources, such as for example DSP slices, BRAM, and programmable resources of an FPGA; however, in other embodiments, digital signal processors, microprocessors, multi-core processors, memory, and/or other hardware may be used. When implemented in software, the elements of the embodiments of the invention are essentially the code segments to perform the necessary tasks. The program or code segments can be stored in a processor-readable storage medium or device that may have been downloaded by way of a computer data signal embodied in a carrier wave over a transmission medium or a communication link. The processor readable storage device may include any medium that can store information including an optical medium, semiconductor medium, and magnetic medium. Processor readable storage device examples include an electronic circuit; a semiconductor device, a semiconductor memory device, a read-only memory (ROM), a flash memory, an erasable programmable read-only memory (EPROM); a floppy diskette, a CD-ROM, an optical disk, a hard disk, or other storage device, The code segments may be downloaded via computer networks such as the Internet, Intranet, etc.

Although particular embodiments have been shown and described, it will be understood that it is not intended to limit the claimed inventions to the preferred embodiments, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A phase locked loop (PLL) circuit, comprising:
    a voltage controlled oscillator (VCO);
    a first loop circuit including a first loop filter, wherein the first loop filter is configured to:
        receive a first signal based on a feedback signal from the VCO; and
        provide a first VCO frequency control signal to the VCO;
    a second loop circuit including a compensation circuit, wherein the compensation circuit is configured to:
        receive a reference signal and the first signal; and
        provide a second VCO frequency control signal to the VCO; and
    a compensation mode selection circuit configured to provide one of the first VCO frequency control signal and second VCO frequency control signal to an input of the VCO.

2. The PLL circuit of claim 1, wherein a first bandwidth of the first loop circuit is greater than a second bandwidth of the second loop circuit.

3. The PLL circuit of claim 2, wherein the first bandwidth is greater than the second bandwidth by at least 10 times the second bandwidth.

4. The PLL circuit of claim 1, wherein the compensation circuit includes:
    an operational amplifier configured to:
        generate a second signal based on the first signal and the reference signal; and
    a second loop filter configured to generate the second VCO frequency control signal based on the second signal.

5. The PLL circuit of claim 4, wherein the second loop filter is a low pass filter configured such that a first bandwidth of the first loop circuit is greater than a second bandwidth of the second loop circuit.

6. The PLL circuit of claim 1, wherein the second VCO frequency control signal has a minimum voltage that is the same as a ground voltage.

7. The PLL circuit of claim 1, wherein the VCO includes a ring oscillator.

8. The PLL circuit of claim 1, wherein the second VCO frequency control signal is configured to control at least one of a varactor of the VCO and a current source of the VCO to control an output frequency of the VCO.

9. The PLL circuit of claim 1, wherein the VCO is configured to:
    receive a third VCO frequency control signal from an open loop temperature dependent voltage circuit.

10. The PLL circuit of claim 9,
    wherein the compensation mode selection circuit is configured to select a compensation mode to control an output frequency of the VCO from:
        a first compensation mode wherein the second VCO frequency control signal is configured to control one of a varactor of the VCO and a current source of the VCO;
        a second compensation mode wherein the second VCO frequency control signal is configured to control the other of the varactor of the VCO and the current source of the VCO;
        a third compensation mode wherein the second VCO frequency control signal is configured to control both the varactor of the VCO and the current source of the VCO; and
        a fourth compensation mode where the third VCO frequency control signal is configured to control both the varactor of the VCO and the current source of the VCO.

11. A method, comprising:
    receiving, by a first loop filter of a first loop circuit, a first signal based on a feedback signal from a voltage controlled oscillator (VCO);
    providing, by the first loop filter, a first VCO frequency control signal to the VCO;
    receiving, by a compensation circuit of a second loop circuit, a reference signal and the first signal; and
    providing, by the compensation circuit, a second VCO frequency control signal to the VCO based on a difference between the reference signal and the first signal,
    providing, by a compensation mode selection circuit, one of the first VCO frequency control signal and second VCO frequency control signal to an input of the VCO.

12. The method of claim 11, wherein a first bandwidth of the first loop circuit is greater than a second bandwidth of the second loop circuit.

13. The method of claim 12, wherein the first bandwidth is greater than the second bandwidth by at least 10 times the second bandwidth.

14. The method of claim 11, further comprising:
    generating, by the compensation circuit, a second signal based on the difference between the first signal and the reference signal; and
    generating, using a second loop filter of the compensation circuit, the second VCO frequency control signal based on the second signal.

15. The method of claim 14, wherein the second loop filter is a low pass filter configured such that a first bandwidth of the first loop circuit is greater than a second bandwidth of the second loop circuit.

16. The method of claim 11, wherein the second VCO frequency control signal has a minimum voltage that is the same as a ground voltage.

17. The method of claim 11, wherein the VCO includes a ring oscillator.

18. The method of claim 11, further comprising:
    controlling, by the second VCO frequency control signal, at least one of a varactor of the VCO and a current source of the VCO to control an output frequency of the VCO.

19. The method of claim 11, further comprising:
receiving, by the VCO, a third VCO frequency control signal from an open loop temperature dependent voltage circuit.

20. The method of claim 19, further comprising:
selecting a compensation mode to control an output frequency of the VCO from:
- a first compensation mode wherein the second VCO frequency control signal is configured to control one of a varactor of the VCO and a current source of the VCO;
- a second compensation mode wherein the second VCO frequency control signal is configured to control the other of the varactor of the VCO and the current source of the VCO;
- a third compensation mode wherein the second VCO frequency control signal is configured to control both the varactor of the VCO and the current source of the VCO; and
- a fourth compensation mode where the third VCO frequency control signal is configured to control both the varactor of the VCO and the current source of the VCO.

\* \* \* \* \*